(12) United States Patent
Nakahori et al.

(10) Patent No.: US 7,952,670 B2
(45) Date of Patent: May 31, 2011

(54) LIQUID CRYSTAL DISPLAY COMPRISING A SEMICONDUCTOR LAYER INTEGRALLY FORMED AND INCLUDING A CROSSOVER PORTION, A TFT PORTION, AND A CONNECTION PORTION AND MANUFACTURING METHOD FOR THE SAME

(75) Inventors: Tadaki Nakahori, Tokyo (JP); Hatsumi Kimura, Tokyo (JP); Fumihiro Goto, Kumamoto (JP); Toshio Araki, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 137 days.

(21) Appl. No.: 11/951,045

(22) Filed: Dec. 5, 2007

(65) Prior Publication Data
US 2008/0198288 A1    Aug. 21, 2008

(30) Foreign Application Priority Data

Feb. 21, 2007  (JP) ................. 2007-040396

(51) Int. Cl.
| | |
|---|---|
| G02F 1/136 | (2006.01) |
| G02F 1/1343 | (2006.01) |
| H01L 31/00 | (2006.01) |
| H01L 29/10 | (2006.01) |
| H01L 29/04 | (2006.01) |
| H01L 29/15 | (2006.01) |
| H01L 27/14 | (2006.01) |
| H01L 31/036 | (2006.01) |

(52) U.S. Cl. ............... 349/140; 349/43; 257/59; 257/72

(58) Field of Classification Search .................. 349/140, 349/147, 148, 42, 43, 45, 46
See application file for complete search history.

(56) References Cited

U.S. PATENT DOCUMENTS
4,990,981 A    2/1991   Tanaka et al.
(Continued)

FOREIGN PATENT DOCUMENTS
JP    2-830    1/1990
(Continued)

OTHER PUBLICATIONS

Advanced Display Inc, Liquid Crystal Display Device and Manufacturing Method Therefor, May 11, 2001, Machine translation of JP 2001-125140 from Patent Abstracts of Japan Website, pp. 1-16.*

*Primary Examiner* — Mark A Robinson
*Assistant Examiner* — Dennis Y Kim
(74) *Attorney, Agent, or Firm* — Oblon, Spivak, McClelland, Maier & Neustadt, L.L.P.

(57) ABSTRACT

According to an aspect of the present invention, there is provided a liquid crystal display that includes a gate electrode and line formed on a transparent insulating substrate, a gate insulating film covering the gate electrode and line, a semiconductor layer formed on the gate insulating film, a source electrode, a source line, and a drain electrode formed on the semiconductor layer, and a pixel electrode connected to the drain electrode. The semiconductor layer is integrally formed of three portions which are a crossover portion of the source line and the drain line, a TFT portion, and a connecting portion connecting the crossover portion to the TFT portion. A part of the crossover portion on the connecting portion side and the whole connecting portion are covered by the source electrode and the source line.

14 Claims, 8 Drawing Sheets

U.S. PATENT DOCUMENTS

| | | | |
|---|---|---|---|
| 6,016,174 A | 1/2000 | Endo et al. | |
| 2001/0052951 A1 | 12/2001 | Ashizawa et al. | |
| 2002/0018176 A1* | 2/2002 | Kobayashi et al. | 349/200 |
| 2003/0107037 A1* | 6/2003 | Youn et al. | 257/59 |
| 2003/0227579 A1* | 12/2003 | Nakahori et al. | 349/43 |
| 2004/0183955 A1* | 9/2004 | Souk et al. | 349/43 |
| 2006/0192201 A1* | 8/2006 | Zhang et al. | 257/59 |
| 2007/0139572 A1* | 6/2007 | Lee | 349/43 |

FOREIGN PATENT DOCUMENTS

| | | | |
|---|---|---|---|
| JP | 10-268353 | | 10/1998 |
| JP | 2001-125140 | | 5/2001 |
| JP | 2001125140 A | * | 5/2001 |
| JP | 2001-343669 | | 12/2001 |
| JP | 2002-14371 | | 1/2002 |
| JP | 2003-303973 | | 10/2003 |
| KR | 2001-0027516 | | 4/2001 |

* cited by examiner

LIQUID CRYSTAL DISPLAY COMPRISING A SEMICONDUCTOR LAYER INTEGRALLY FORMED AND INCLUDING A CROSSOVER PORTION, A TFT PORTION, AND A CONNECTION PORTION AND MANUFACTURING METHOD FOR THE SAME

BACKGROUND OF THE INVENTION

1. Field of the Invention

The present invention relates to a liquid crystal display (LCD) and a manufacturing method for the same, and particularly to an active matrix type LCD using thin film transistors (TFTs) as pixel switching elements and a manufacturing method for the same.

2. Description of Related Art

In recent years, in a field of display devices using semiconductor devices, LCDs characterized by reduced energy and space are rapidly becoming common in place of CRTs. An LCD has a plurality of electrodes, lines and devices over a transparent insulating substrate. To be more specific, active matrix type LCDs are widely used in which switching devices such as thin film transistors (TFTs) having scanning and signal lines, gate, source and drain electrodes are provided in array and an independent video signal is applied to electrodes of each display pixel.

To manufacture this active matrix type LCD, a manufacturing method that performs five photolithography processes (hereinafter referred to as a five mask process) has been common as disclosed in Japanese Unexamined Patent Application Publication No. 10-268353.

In the five mask process, wet etching by wet chemical etchant or dry etching by reactive gases can be used in patterning source electrodes and lines of TFTs. Although wet etching is inferior in miniaturization and processing accuracy to dry etching, wet etching is superior in costs such as equipment prices and running costs to dry etching.

In wet etching, if there is even a slight gap between a metal film which is etched to form source electrodes and lines and its lower layer, the etchant may penetrate into the gap and which may cause source electrodes and lines to disconnect. This disconnection tends to occur if the lower layer of the metal film for source electrodes and lines has a bump. Further, if the lower layer is composed of semiconductor such as amorphous silicon, photoresist residue of the previous process tends to remain on the lower layer. The photoresist residue may also cause disconnection. Therefore, the disconnection may most easily occur if the lower layer composed of semiconductor has a bump.

To prevent disconnection, an LCD shown in FIG. 8 is disclosed in Japanese Unexamined Patent Application Publication No. 2001-125140. The LCD shown in FIG. 8 has a gate electrode and line 2, a source line 6a, a source electrode 6b, a drain electrode 7 and a semiconductor layer 10. The semiconductor layer 10 is island-shaped under the source line 6a which covers the whole semiconductor layer 10. Thus, etchant penetration can be prevented. On the other hand, an island-shaped semiconductor layer is also disclosed to prevent photocurrent in Japanese Unexamined Patent Application Publications No. 2003-303973 and No. 2-830, for example.

By the way, high aperture ratio is required to match high-resolution LCDs in recent years. Thus, although finer source lines are requested, there is a limit to thinning of source lines of the LCD shown in Japanese Unexamined Patent Application Publication No. 2001-125140.

SUMMARY OF THE INVENTION

The present invention is made in consideration of the above situation and aims to provide an active matrix type LCD with excellent reliability, productivity and high resolution.

According to an aspect of the present invention, there is provided a liquid crystal display that includes a gate electrode and line formed on a transparent insulating substrate, a gate insulating film covering the gate electrode and line, a semiconductor layer formed on the gate insulating film, a source electrode, a source line, and a drain electrode formed on the semiconductor layer, and a pixel electrode connected to the drain electrode. The semiconductor layer is integrally formed of three portions which are a crossover portion of the source line and the drain line, a TFT portion, and a connecting portion connecting the crossover portion to the TFT portion. A part of the crossover portion on the connecting portion side and the whole connecting portion are covered by the source electrode and the source line.

According to another aspect of the present invention, there is provided a method of manufacturing a liquid crystal display that includes forming a first metal film on a transparent insulating substrate, forming a gate electrode and line by patterning the first metal film, sequentially forming a gate insulating film and a semiconductor layer to cover the gate electrode, patterning the semiconductor layer, forming a second metal film on the semiconductor layer, and forming a source electrode, a source line, and a drain electrode by patterning the second metal film by wet etching. The semiconductor layer is integrally formed of three portions which are a crossover portion of the source line and the drain line, a TFT portion, and a connecting portion connecting the crossover portion to the TFT portion. A part of the crossover portion on the connecting portion side and the whole connecting portion are covered by the source electrode and the source line.

The present invention is able to provide an active matrix type LCD with excellent reliability, productivity and high resolution.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
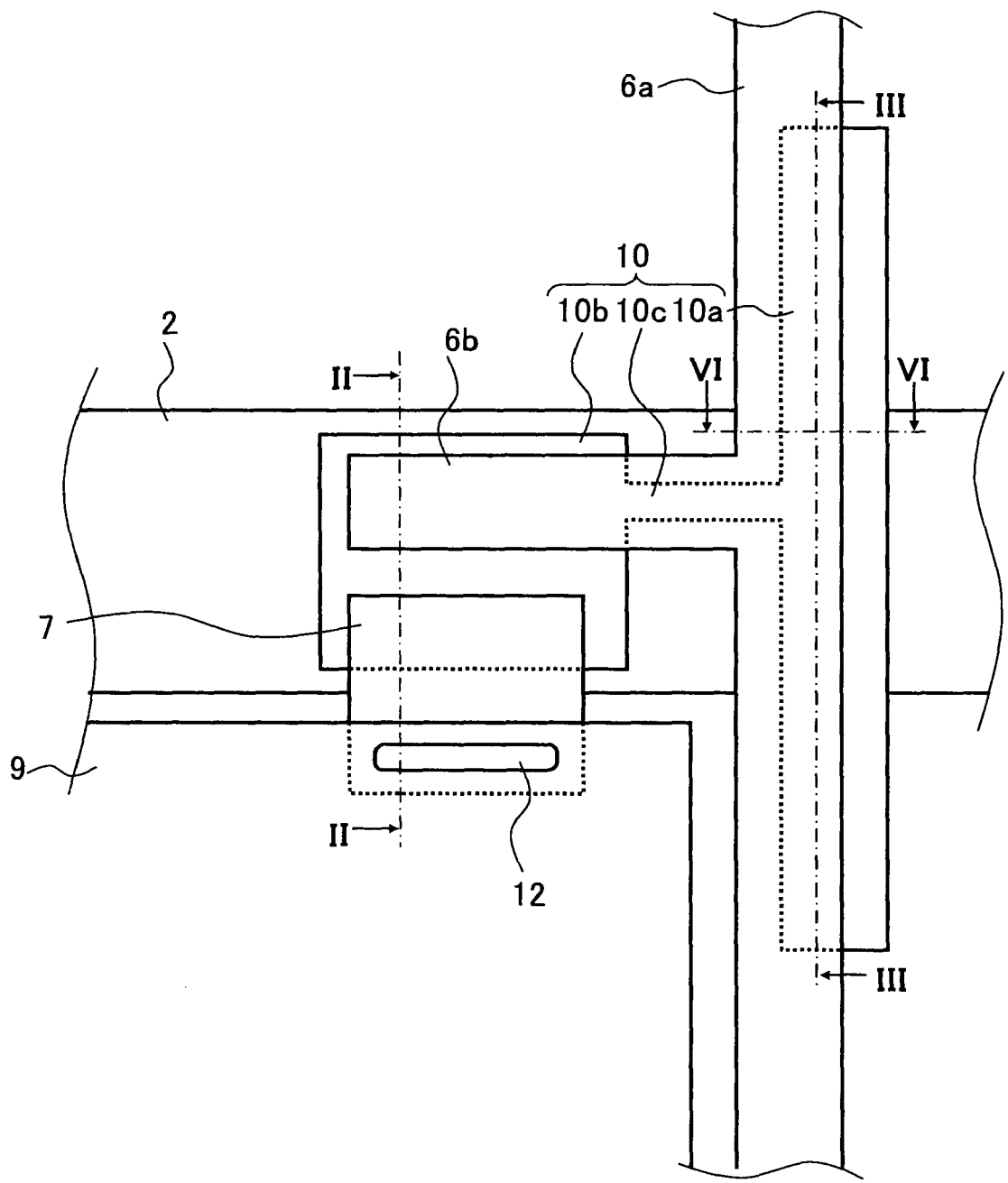
FIG. 1 is a plan view showing a TFT array substrate of an active matrix type LCD according to a first embodiment.

An embodiment of a TFT array substrate used in an active matrix type liquid crystal display according to the present invention is described hereinafter in detail. However the present invention is not limited to the embodiments below. Furthermore, the drawing figures and explanations are appropriately omitted or simplified in the interest of clarity.

First Embodiment

Figure 2:
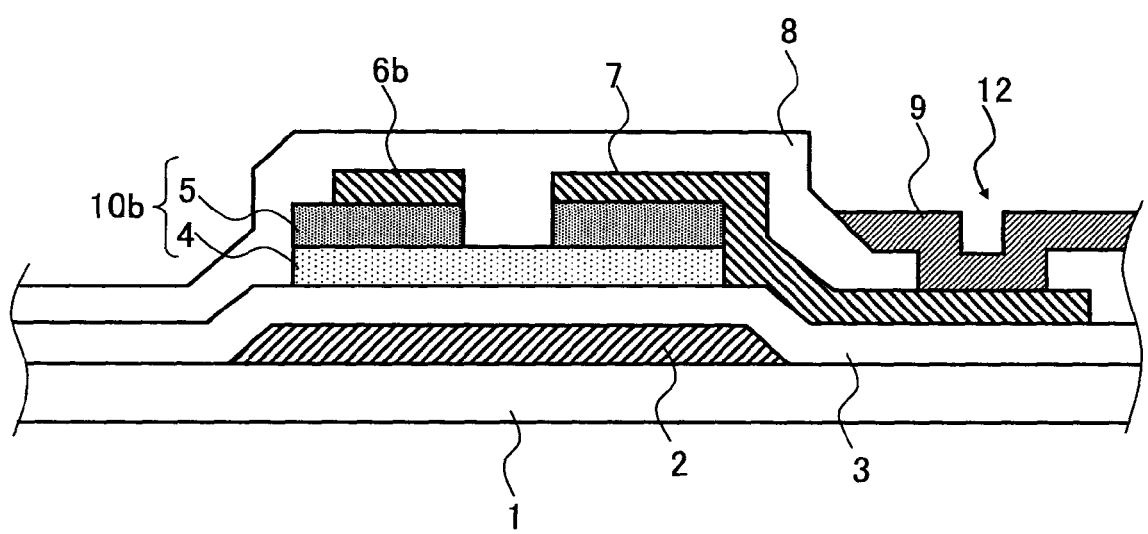
FIG. 2 is a cross-sectional diagram taken along the line II-II of FIG. 1.
Figure 3:
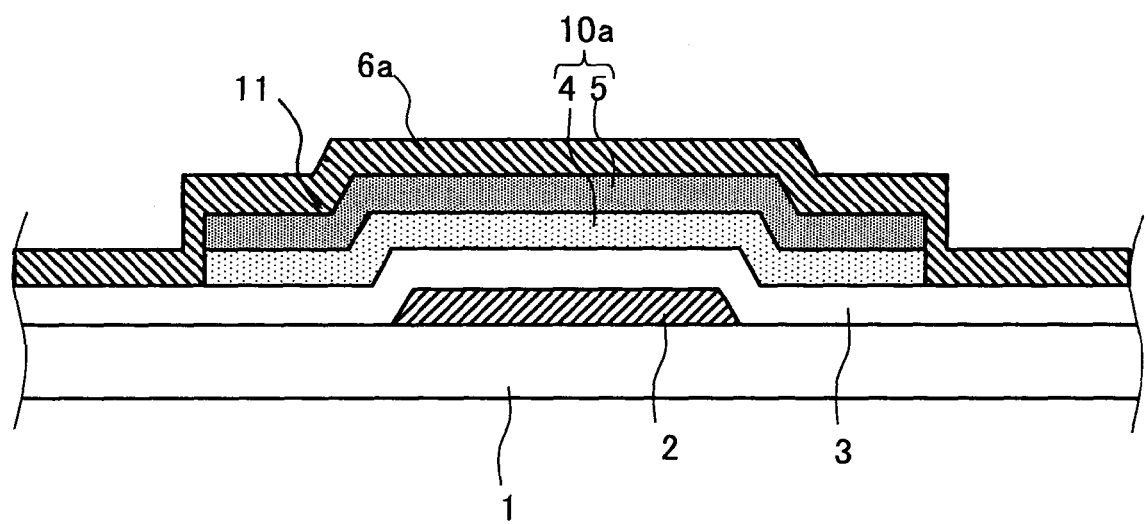
FIG. 3 is a cross-sectional diagram taken along the line III-III of FIG. 1.
Figure 4:
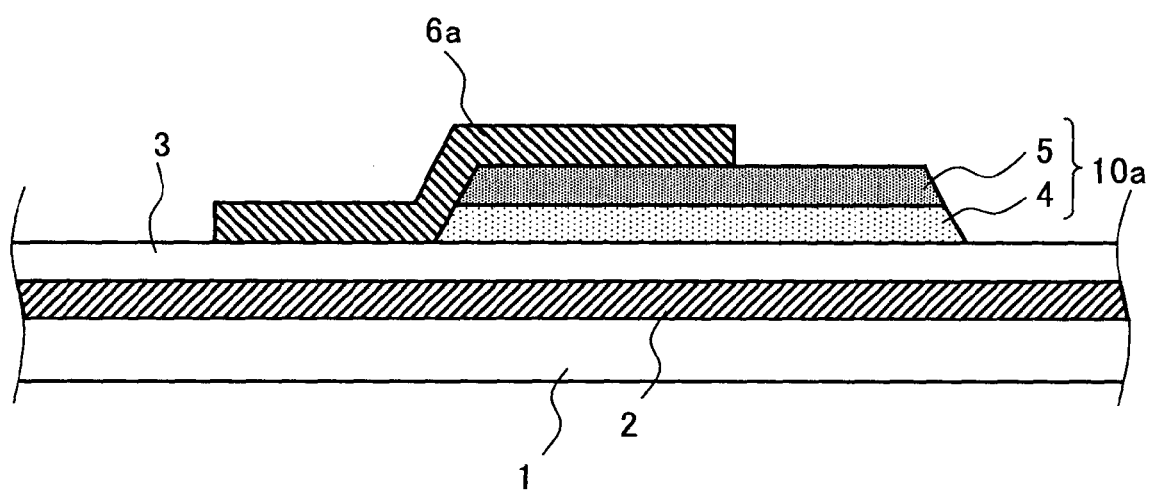
FIG. 4 is a cross-sectional diagram taken along the line IV-IV of FIG. 1.

FIG. 1 is a plan view showing a TFT forming area of a TFT array substrate of an active matrix type LCD according to a first embodiment. FIG. 2 is a cross-sectional diagram taken along the line II-II of FIG. 1. FIG. 3 is a cross-sectional diagram taken along the line III-III of FIG. 1. FIG. 4 is a cross-sectional diagram taken along the line IV-IV of FIG. 1.

As shown in FIG. 2, the TFT array substrate according to the first embodiment includes a transparent insulating substrate 1, a gate electrode and line 2, a gate insulating film 3, a semiconductor active film 4, an ohmic contact film 5, a source electrode 6b, a drain electrode 7, a passivation film 8, and a pixel electrode 9. Here, the semiconductor active film 4 and the ohmic contact film 5 make up a semiconductor layer 10. As hereinafter described in detail, the semiconductor layer 10 has a crossover portion of the source and drain lines 10a, a TFT portion 10b and a connecting portion 10c.

As for the transparent insulating substrate 1, a transparent insulating substrate such as a glass substrate or a silica glass substrate can be used. The thickness of the insulating substrate 1 may be any but preferably not more than 1.1 mm in order to reduce the thickness of a liquid crystal display. If the insulating substrate 1 is too thin, the substrate is distorted due to a thermal history of processes thereby decreasing patterning accuracy. Thus, the thickness of the insulating substrate 1 needs to be selected in consideration over the process to be used. Further, if the insulating substrate 1 is made from brittle material such as a glass, edge face of the substrate is preferably chamfered so as to prevent any foreign matters from getting inside. Further, it is preferable that a notch is created at a part of the transparent insulating substrate 1 to identify the orientation of the substrate for easier process management.

The gate electrode and line 2 is formed on the transparent insulating substrate 1. As for the gate electrode and line 2, a metal film mainly containing Al, Mo, Cr, Ta, Ti, Cu or the like having a thickness of approx. 100 to 500 nm may be used.

The gate insulating film 3 is formed on the transparent insulating substrate 1 and the gate electrode and line 2. As for the gate insulating film 3, a silicon nitride film ($SiN_x$), a silicon oxide film ($SiO_x$), a silicon nitric-oxide film ($SiO_xN_y$) and a laminated film thereof having a thickness of approx. 300 to 600 nm may be used. If the film is thin, it is likely to generate a short-circuit in a crossover region of the gate and source lines, thus the film preferably has a thickness of more than that of the gate electrode and line 2. On the other hand, if the film thickness is thick, an ON current of TFT decreases and thus the display characteristic is degraded.

The semiconductor active film 4 is formed on the gate insulating film 3. As for the semiconductor active film 4, an amorphous silicon (a-Si) film or a polycrystalline silicon (p-Si) film having a thickness of approx. 100 to 300 nm may be used. If the film is thin, the film is likely to disappear at a dry etching of the ohmic contact film 5, which is described later in detail. On the other hand, if the film is thick, the ON current of TFT decreases.

If a-Si film is used for the semiconductor active film 4, an interface to the a-Si film of the gate insulating film 3 is preferably $SiN_x$ or $SiO_xN_y$ in light of controllability and reliability of a threshold voltage ($V_{th}$) of the TFT, which is a gate voltage to make the TFT conductive. On the other hand, if a p-Si film is used for the semiconductor active film 4, an interface to the p-Si film of the gate insulating film 3 is preferably $SiO_x$ or $SiO_xN_y$ in light of controllability and reliability of $V_{th}$ of the TFT.

The ohmic contact film 5 is formed on the semiconductor active film 4. As for the ohmic contact film 5, an n-type a-Si film or an n-type p-Si film having a thickness of approx. 20 to 70 nm can be used. The n-type a-Si or p-Si is a-Si or p-Si doped with a small amount of P.

Here, the semiconductor active film 4 and the ohmic contact film 5, or the semiconductor layer 10 are formed of three portions which are a crossover portion of the source and drain lines 10a, TFT portion 10b, and a connecting portion 10c as shown in FIG. 1. The crossover portion of the source and drain lines 10a is formed in a region in which the source line 6a and the gate electrode and line 2 intersect in the plan view. The TFT portion 10b constitutes TFT. The connecting portion 10c connects the crossover portion of the source and drain lines 10a to the TFT portion 10b. As a matter of course, as shown in FIG. 1, since the ohmic contact film 5 is removed, the semiconductor layer 10 only has the semiconductor active film 4 in the TFT channel region.

The source electrode 6b and the drain electrode 7 are formed on the ohmic contact film 5 and are connected to the semiconductor active film 4 with the ohmic contact film 5 interposed therebetween. Further, the source electrode 6b diverges from the source line 6a in the region in which the source line 6a and the gate electrode and line 2 intersect in the plan view as shown in FIG. 1. The source line 6a extends to a source terminal (not shown) in a vertical direction to the gate electrode and line 2. The source line 6a, the source electrode 6b and the drain electrode 7 are formed from the same metal film which mainly contains Al, Mo, Cr, Ta, Ti, Cu or the like having a thickness of approx. 100 to 500 nm.

Here, as shown in FIG. 1, the source line 6a and the source electrode 6b cover a part of the crossover portion of the source and drain lines 10a on the connecting portion 10c side and the whole connecting portion 10c of the semiconductor layer 10. FIG. 3 is a cross-sectional diagram taken along the line III-III of FIG. 1. As shown in FIG. 3, the semiconductor active film 4 and the ohmic contact film 5, or the crossover portion of the source and drain lines 10a as well as the gate insulation film 3 is formed on the gate electrode and line 2, which improves the insulation property.

FIG. 4 is a cross-sectional diagram taken along the line IV-IV of FIG. 1. As shown in FIG. 4, the part of the crossover portion of the source and drain lines 10a on the connecting portion 10c side is covered by the source line 6a. To be more specific, the whole end face of the crossover portion of the source and drain lines 10a on the connecting portion 10c side is covered by the source line 6a. On the other hand, the whole end face of the crossover portion of the source and drain lines 10a on the opposite side is not covered by the source line 6a. Therefore, the source line 6a can be thinned. Further, even if an etchant penetrates between the source line 6a and the semiconductor layer 10 from the right side of FIG. 4, undesirable etching does not progress to the left end of the source line 6a in FIG. 4. Thus, disconnection of the source line 6a can be prevented. Therefore, the present invention can prevent source electrodes and lines from disconnecting and thin source lines at the same time. Here, since etching residue tends to remain in a contaminated portion 11 shown in FIG. 3, an etchant penetrates easily from the contaminated portion 11.

Moreover, as shown in FIGS. 1 and 2, the TFT portion 10b is formed immediately above the gate electrode and line 2 in the first embodiment. In other words, when observed from the vertical direction of a principal plane of the transparent insulating substrate 1, the whole TFT portion 10b is included in the gate electrode and line 2. Thus, since the TFT portion 10b is formed on a flat region of the gate insulating film 3, an etchant can hardly penetrate between the TFT portion 10b and the drain electrode 7. Therefore, disconnection of the drain electrode 7 can be prevented.

The passivation film 8 is formed on the source line 6a, the source electrode 6b and the drain electrode 7 or the like. As for the passivation film 8, a similar material as the gate insulating film 3 can be used.

The pixel electrode 9 is formed on the passivation film 8 and is connected to the drain electrode 7 through a contact hole 12 penetrating the passivation film 8. As for the pixel electrode 9, a transparent conductive film composed of ITO or the like can be used.

Next, a manufacturing method of the TFT array substrate according to the first embodiment is described hereinafter. Note that the example below is a typical example and it is needless to say that other manufacturing method can be employed without departing from the scope and spirit of the invention.

Firstly, a first metal film for forming the gate electrode and line 2 is formed on the insulating substrate 1 with its surface cleansed by a sputtering, a vacuum deposition method or the like.

Secondly, the first metal film is patterned by a first photolithography process to form the gate electrode and line 2. The photolithography process is described as follows. After the insulating substrate 1 having the first metal film is cleansed, photoresist is coated on the first metal film and dried. Then, the photoresist is exposed through a mask pattern and developed so as to form a resist pattern transcribed by the mask pattern onto the insulating substrate 1. Further, after hardening the photoresist by heat treatment, the first metal film is etched. Then, the resist pattern is removed. If the wettability between the photoresist and the first metal film is not favorable, UV cleansing, HMDS (hexamethyldisilazane) steam coating or the like is performed before coating the photoresist.

If the adherence between the photoresist and the first metal film is not favorable and which causes to separate them, the heat hardening temperature or the time for heat hardening is increased as appropriate. The first metal film can be wet-etched by an etchant. Here, the first metal film is preferably etched so that a pattern edge is formed in a taper shape in light of preventing a short-circuit in bumps with other lines. Thus, the cross sectional view of the gate electrode and line 2 becomes trapezoid as shown in FIG. 2.

Next, thin films for forming the gate insulating film 3 made from $SiN_x$, $SiO_x$, $SiO_xN_y$ or the like, the semiconductor active film 4 made from a-Si or p-Si, and the ohmic film 5 made from n-type a-Si or p-Si are formed continuously by the plasma CVD method. When using the a-Si film as the semiconductor active film 4, a lower film forming rate around the interface to the gate insulating film 3 and a higher film forming rate in the upper layer portion make it possible to obtain TFTs with large mobility and small leak current at OFF time in a short time. The $SiN_x$, $SiO_x$, $SiO_xN_y$, a-Si, p-Si, n-type a-Si and n-type p-Si films can be dry-etched by a known gas ($SiH_4$, $NH_3$, $H_2$, $NO_2$, $PH_3$, $N_2$ or mixed gas of the aforementioned gas).

Next, the semiconductor active film 4 and ohmic contact film 5 are patterned to remain at least in a TFT forming area by a second photolithography process. The whole gate insulating film 3 remains. The semiconductor active film 4 and the ohmic contact film 5 may be dry-etched by a known gas (for example, mixed gas of $SF_6$ and $O_2$ or a mixed gas of $CF_4$ and $O_2$).

Next, a second metal film for forming the source electrode 6b and the drain electrode 7 is formed by a method such as sputtering. From the second metal film, the source line 6a (see FIG. 1), a source terminal (not shown), source electrode 6b, and drain electrode 7 are formed by a third photolithography process. The second metal film can be wet-etched. When the second metal film is composed of Cr, for example, a ceric ammonium nitrate-based etchant can be used.

Then, the ohmic contact film 5 is etched. A central part of the ohmic contact film 5 in the TFT portion 10b is removed by this process to expose the semiconductor active film 4. The ohmic contact film 5 can be dry-etched by a known gas (for example, mixed gas of $SF_6$ and $O_2$ or mixed gas of $CF_4$ and $O_2$).

Next, a film for forming the passivation film 8 made from $SiN_x$, $SiO_x$, $SiO_xN_y$ or the like is formed by the plasma CVD method. The passivation film 8 is formed from the film by a forth photolithography process. Photoresist is uniformly exposed by using a light shielding mask (not shown) with an opening in a portion corresponding to the contact hole 12 shown in FIG. 1. After the exposure, the photoresist is developed using developer. Then, the contact hole 12 is formed by an etching process so as to expose the drain electrode 7.

Then, a transparent conductive thin film for forming the pixel electrode 9 is formed by sputtering, vacuum evaporation, coating or the like. The pixel electrode 9 is made from the transparent conductive thin film by a fifth photolithography process.

The TFT array substrate manufactured in this way is bonded with an opposing substrate (not shown) having a color filter and an opposing electrode with a spacer interposed therebetween, and the space is filled with liquid crystal. An LCD is made by mounting this liquid crystal panel to a backlight unit.

Second Embodiment

Figure 5:
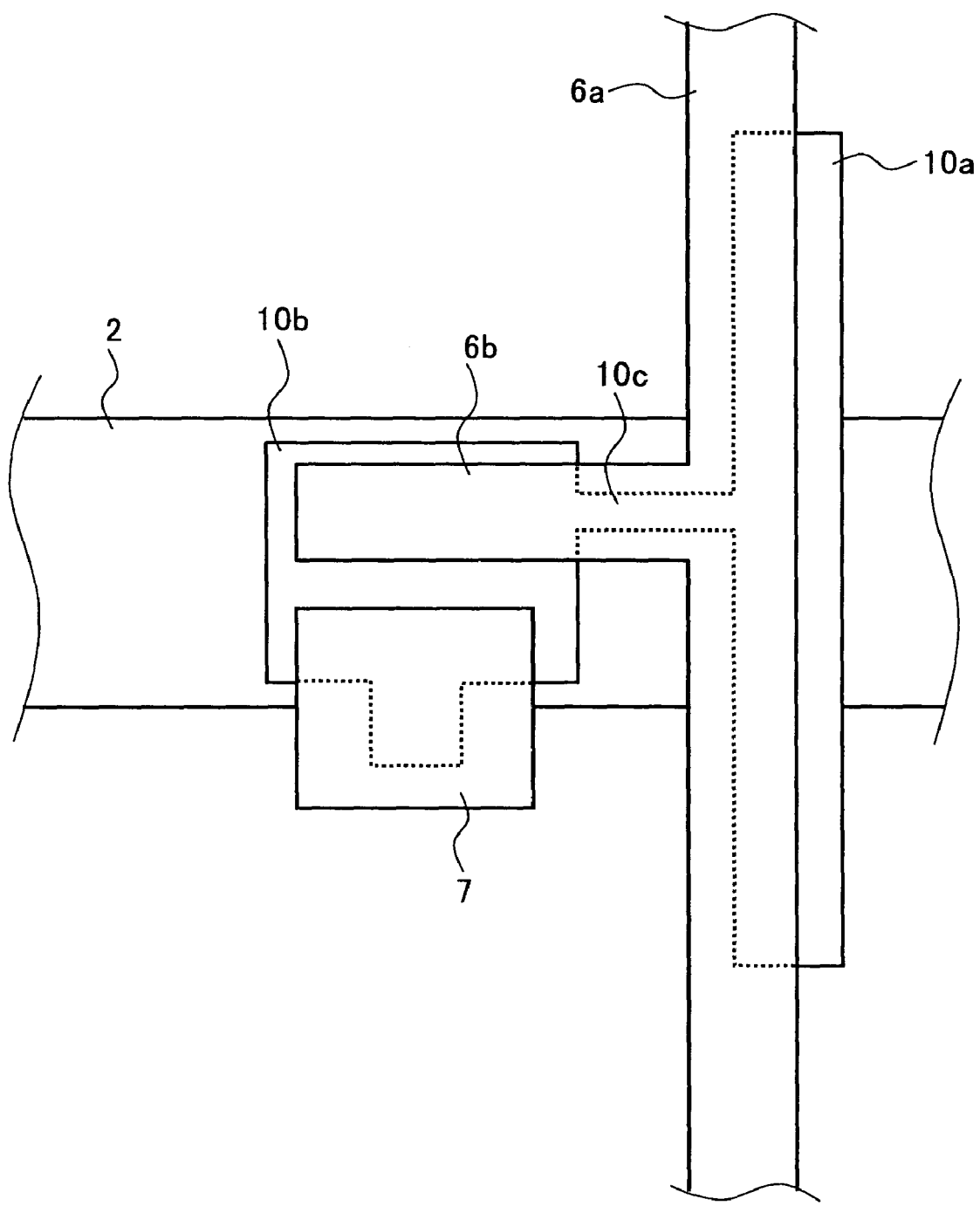
FIG. 5 is a plan view showing a TFT array substrate of an active matrix type LCD according to a second embodiment.
Figure 6:
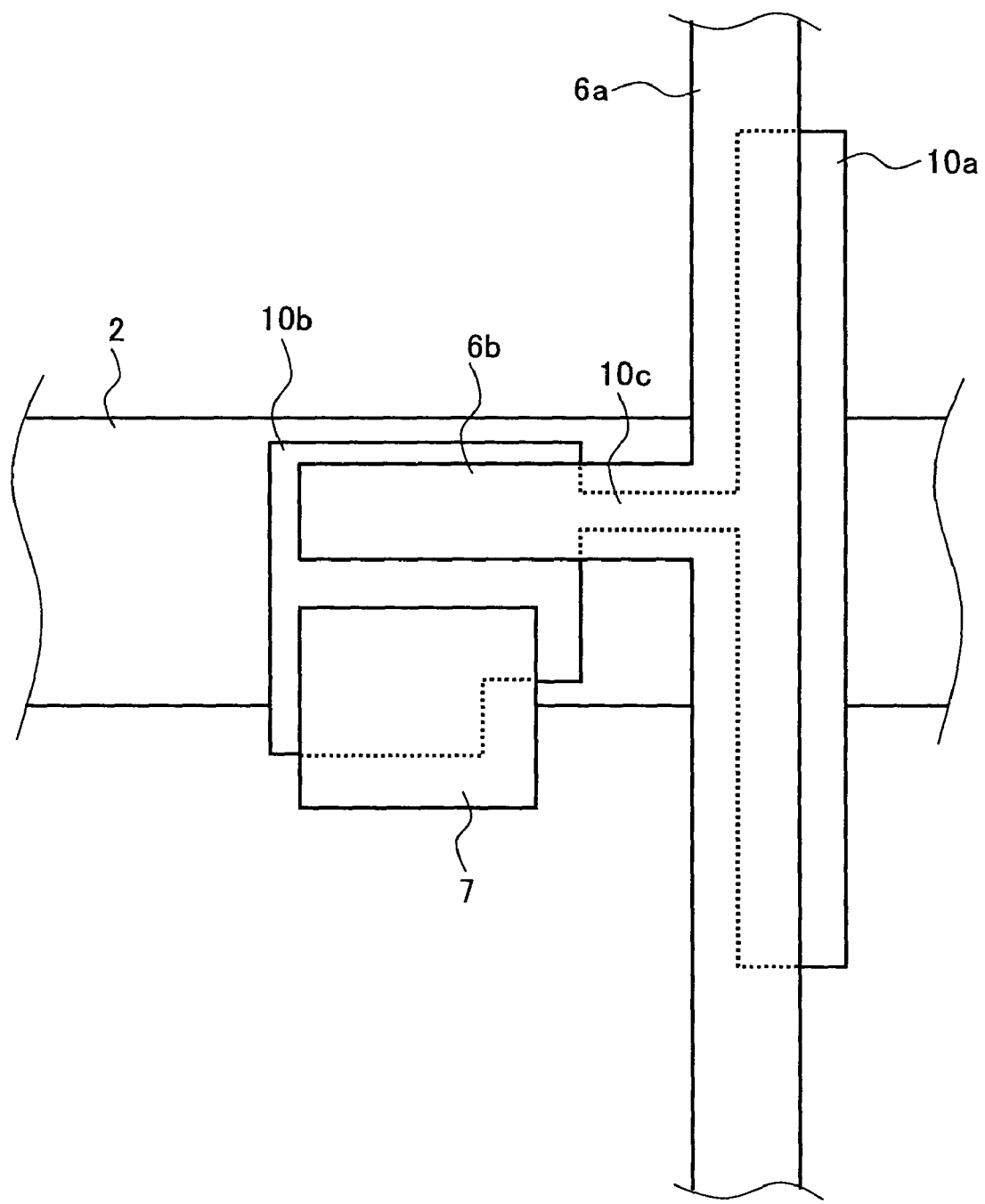
FIG. 6 is a plan view showing another TFT array substrate of an active matrix type LCD according to the second embodiment.
Figure 7:
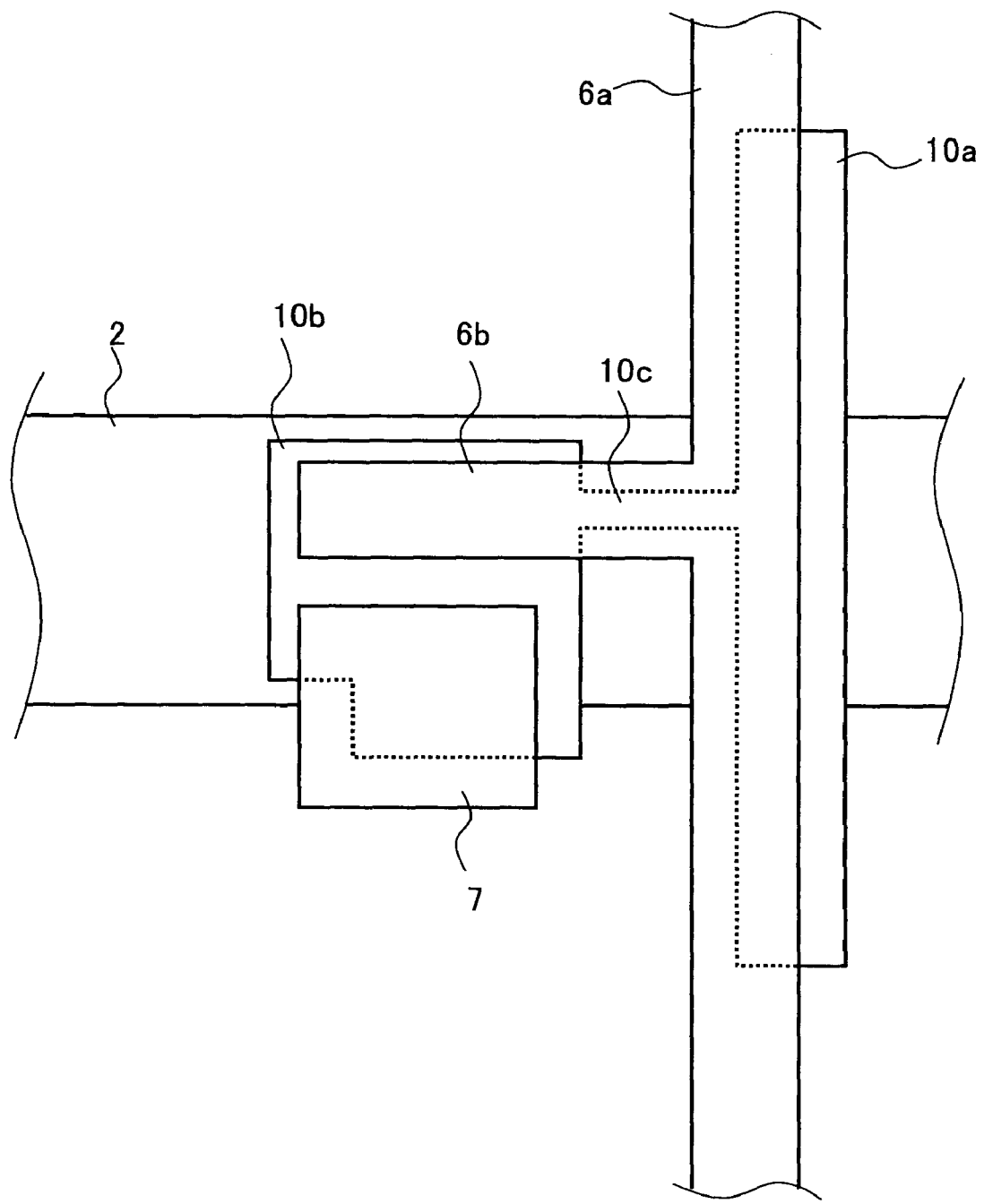
FIG. 7 is a plan view showing another TFT array substrate of an active matrix type LCD according to the second embodiment.
Figure 8:
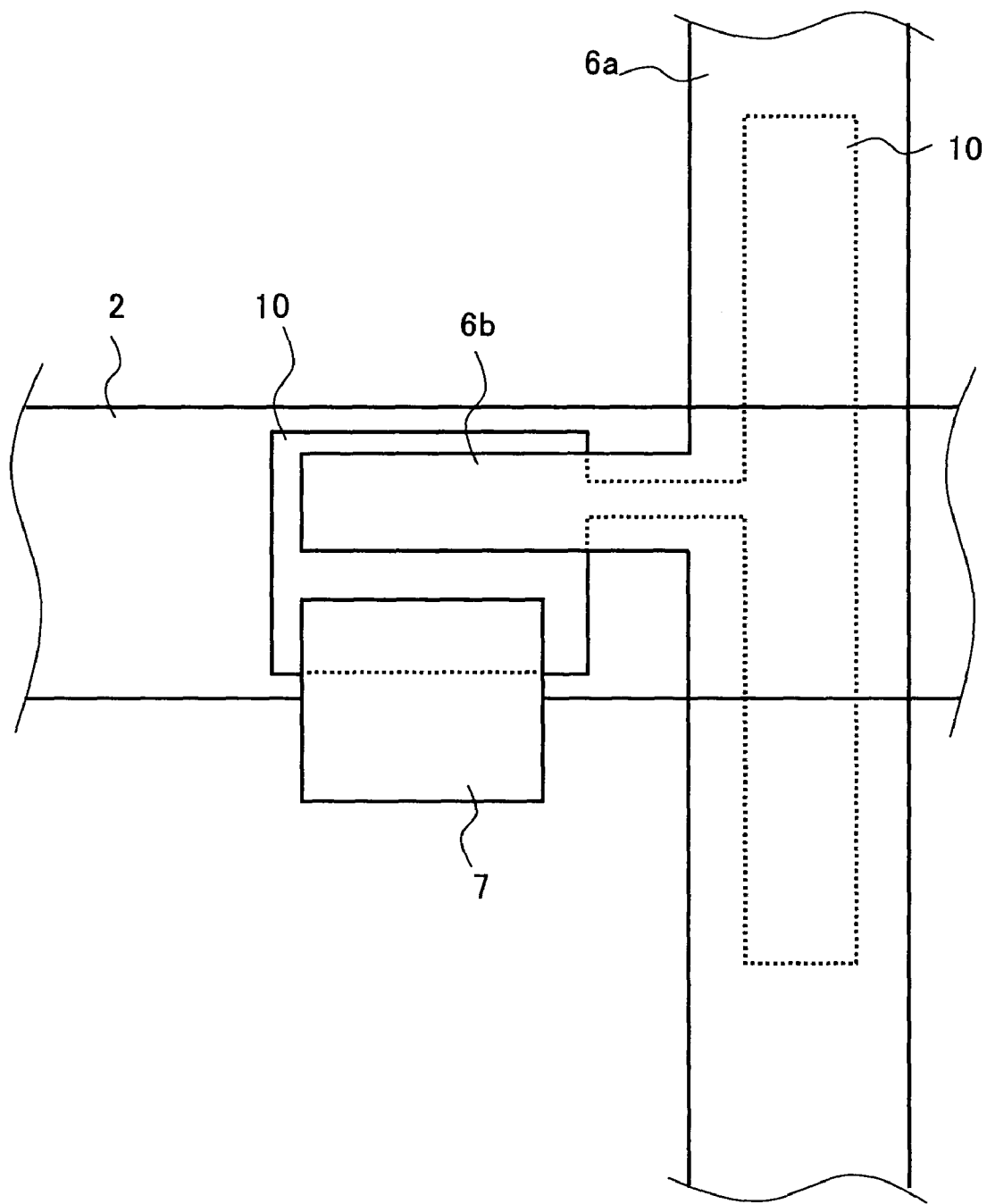
FIG. 8 is a plan view showing a TFT array substrate of a related active matrix type LCD.

An embodiment different from the TFT array substrate of the first embodiment is described hereinafter. In the explanation below, components identical to those in the first embodiment are denoted by reference numerals identical therein with detailed description omitted as appropriate. Here, FIGS. 5 to 7 show positional relations of the gate electrode and line 2, the source line 6a, the source electrode 6b, the drain electrode 7, and the semiconductor layer 10. Other components are omitted.

FIG. 5 is a plan view showing a TFT forming area of a TFT array substrate of an active matrix type LCD according to a second embodiment. In the first embodiment, when observed from the vertical direction of a principal plane of the transparent insulating substrate 1, the whole TFT portion 10b is included in the gate electrode and line 2 as shown in FIG. 1. On the other hand, in the second embodiment, when observed from the vertical direction of a principal plane of the transparent insulating substrate 1, a part of the TFT portion 10b protrudes from the gate electrode and line 2 under the drain electrode 7. However, when observed from the vertical direction of a principal plane of the transparent insulating substrate 1, two points at which the circumference of the TFT portion 10b intersects the circumference of the drain electrode 7 are included in the gate electrode and line 2 as in the first embodiment. Thus, since an etchant can hardly penetrate between the TFT portion 10b and the drain electrode 7, disconnection of the drain electrode 7 can be prevented.

Further, as shown in FIGS. 6 and 7, when observed from the vertical direction of a principal plane of the transparent insulating substrate 1, if at least one point of the two points at which the circumference of the TFT portion 10b intersects the circumference of the drain electrode 7 is included in the gate electrode and line 2, disconnection of the drain electrode 7 can be prevented.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A liquid crystal display comprising:
   a gate electrode of a TFT and a gate line formed on a transparent insulating substrate;
   a gate insulating film covering the gate electrode and gate line;
   a semiconductor layer formed on the gate insulating film;
   a source electrode of the TFT, a source line, and a drain electrode of the TFT formed on the semiconductor layer; and
   a pixel electrode connected to the drain electrode,
   wherein the semiconductor layer is integrally formed of three portions for the TFT, the three portions including (i) a crossover portion having an elongated shape extending in parallel with a longitudinal direction of the source line and extending to a length that is wider than a structure formed by the source electrode and the drain electrode, (ii) a TFT portion forming an active region for the TFT, and (iii) a connecting portion arranged in parallel with the gate line connecting the crossover portion to the TFT portion, and
   wherein a part of an entire length of the elongated crossover portion on an opposite side with respect to the connecting portion side is not covered by the source line, and the other part of the entire length of the elongated crossover portion on a same side with respect to the connecting portion side is covered by the source line, and the whole connecting portion is covered by the source electrode and the source line.

2. The liquid crystal display according to claim 1, wherein at least one point of the two points at which a circumference of the TFT portion intersects a circumference of the drain electrode is included in the gate electrode and gate line when observed from the vertical direction of a principal plane of the transparent insulating substrate.

3. The liquid crystal display according to claim 2, wherein both of the two points at which the circumference of the TFT portion intersects the circumference of the drain electrode are included in the gate electrode and gate line when observed from the vertical direction of the principal plane of the transparent insulating substrate.

4. The liquid crystal display according to claim 3, wherein the TFT portion is included in the gate electrode and gate line when observed from the vertical direction of the principal plane of the transparent insulating substrate.

5. The liquid crystal display according to claim 1, wherein the semiconductor layer comprises a semiconductor active film and an ohmic contact film.

6. A method of manufacturing a liquid crystal display comprising:
   forming a first metal film over a transparent insulating substrate;
   forming a gate electrode of a TFT and gate line by patterning the first metal film;
   sequentially forming a gate insulating film and a semiconductor layer to cover the gate electrode;
   patterning the semiconductor layer;
   forming a second metal film over the semiconductor layer; and
   forming a source electrode of the TFT, a source line, and a drain electrode of the TFT by patterning the second metal film by wet etching,
   wherein the semiconductor layer is integrally formed of three portions for the TFT, the three portions including (i) a crossover portion having an elongated shape extending in parallel with a longitudinal direction of the source line and extending to a length that is wider than a structure formed by the source electrode and the drain electrode, (ii) a TFT portion forming an active region for the TFT, and (iii) a connecting portion arranged in parallel with the gate line connecting the crossover portion to the TFT portion, and
   wherein a part of an entire length of the elongated crossover portion on an opposite side with respect to the connecting portion side is not covered by the source line, and the other part of the entire length of the elongated crossover portion on a same side with respect to the connecting portion side is covered by the source line, and the whole connecting portion is covered by the source electrode and the source line.

7. The method of manufacturing the liquid crystal display according to claim 6, wherein at least one point of the two points at which a circumference of the TFT portion intersects a circumference of the drain electrode is included in the gate electrode and gate line when observed from the vertical direction of a principal plane of the transparent insulating substrate.

8. The method of manufacturing the liquid crystal display according to claim 7, wherein both of the two points at which the circumference of the TFT portion intersects the circumference of the drain electrode are included in the gate electrode and gate line when observed from the vertical direction of the principal plane of the transparent insulating substrate.

9. The method of manufacturing the liquid crystal display according to claim 8, wherein the TFT portion is included in the gate electrode and gate line when observed from the vertical direction of the principal plane of the transparent insulating substrate.

10. The method of manufacturing the liquid crystal display according to claim 6, wherein the semiconductor layer comprises a semiconductor active film and an ohmic contact film.

11. The liquid crystal display according to claim 1, wherein a width of the connecting portion is narrower than a width of the source electrode, narrower than a width of the crossover portion, and narrower than a width of the TFT portion.

12. The method of manufacturing the liquid crystal display according to claim 6, wherein a width of the connecting portion is narrower than a width of the source electrode, narrower than a width of the crossover portion, and narrower than a width of the TFT portion.

13. The liquid crystal display according to claim 1, wherein the source line is arranged to cover a side wall of the crossover portion at the part of the crossover portion on the connecting portion side.

14. The method of manufacturing the liquid crystal display according to claim 6, wherein the source line is arranged to cover a side wall of the crossover portion at the part of the crossover portion on the connecting portion side.

* * * * *